(12) United States Patent
Koike et al.

(10) Patent No.: US 6,894,277 B2
(45) Date of Patent: May 17, 2005

(54) SCANNING ELECTRON MICROSCOPE

(75) Inventors: Hirotami Koike, Tokyo (JP); Kouji Kimura, Tokyo (JP)

(73) Assignee: Kabushiki Kaisha Topcon, Tokyo (JP)

( * ) Notice: Subject to any disclaimer, the term of this patent is extended or adjusted under 35 U.S.C. 154(b) by 0 days.

(21) Appl. No.: 10/615,531

(22) Filed: Jul. 8, 2003

(65) Prior Publication Data
US 2004/0011959 A1 Jan. 22, 2004

(30) Foreign Application Priority Data
Jul. 18, 2002 (JP) ........................................ 2002-208990

(51) Int. Cl.$^7$ ............................................. H01J 37/20
(52) U.S. Cl. ............................... 250/310; 250/396 ML
(58) Field of Search .......................... 250/310, 396 ML

(56) References Cited

U.S. PATENT DOCUMENTS 3,937,959 A * 2/1976 Namae ....................... 250/310
6,642,520 B2   11/2003 Kimura et al.
6,717,144 B2    4/2004 Kimura et al.

* cited by examiner

Primary Examiner—Kiet T. Nguyen
(74) Attorney, Agent, or Firm—Chapman and Cutler LLP

(57) ABSTRACT

A scanning electron microscope in the present invention includes an electron source 1 to radiate an electron beam, an objective lens system 9 to focus the radiated electron beam on a sample 10, scanning systems 5, 8 to scan the focused electron beam on the sample, secondary electron detection systems 3,4 to detect secondary electrons emitted from the sample 10, and a secondary electron image displaying system 13 to display a secondary electron image of the sample 10 with a secondary electron detection signal from the secondary electron detection system.

The objective lens 9 is composed of first and second objective lenses 11, 12. The first objective lens 11 is mainly excited when using in a wide visual field mode and the second objective lens 12 is mainly excited when using in a high resolution mode.

17 Claims, 3 Drawing Sheets

SCANNING ELECTRON MICROSCOPE

BACKGROUND OF INVENTION

1. Field of Invention

The present invention relates to a scanning electron microscope which includes a wide visual field mode (a mode for inspection of large area) and a high resolution mode (a mode for observation of high resolution).

2. Description of the Prior Art

Recently, a pattern size in a LSI is less than a wavelength for exposing it, below a design rule of 250 nm because of acceleration of miniaturization of the LSI. Therefore, ultra resolution techniques using proximity effect correction, phase shift mask, and so on have been required.

In process control under such circumstance, a conventional method for measuring one-dimensional length, which controls only width of line of the pattern, has not be useful any more. Therefore, two-dimensional control or three-dimensional control of the pattern for the process control has been demanded.

In the process control, throughput is an important factor. A process control which measures a large area of mask and resist pattern in a short time and compares the measurement with standard pattern and CAD data is required. In order to carry out this control, a scanning electron microscope capable of scanned a large area of 1000 $\mu$m to 2000 $\mu$m squares with the resolution of 20 nm to 50 nm is required.

Usually, one side of area of chip is 10 mm to 20 mm. In the pattern inspection, in order to improve the throughput, it is necessary to observe the area as large as possible without strain even though quality of resolution is lowered in some degree. Consequently, it is appropriate to use objective lens with long focal lengths.

On the other hands, when a defect is found in the mask and resist pattern, it is necessary to observe the part in detail with high resolution in order to analyze the defect and clarify the cause. In order to observe the defect, a scanning electron microscpe having the high resolution of the order of 3 nm to 5 nm, is required. Therefore, it is desirable to use an objective lens with short focal length for the inspection of defect.

However, it is difficult to scan the large area without the strain by the objective lens with short focal length. Therefore, these two requirements are incompatible.

Meanwhile, a conventional method for inspection of light using laser beam is practically much faster than electron beam, considering the throughput. However, the resolution of light is limited by wavelength.

Even in case of using ultraviolet rays, the resolution is limited on the scope of 50 nm to 100 nm under the present condition.

An advantage of using an electronic microscope is to achieve the resolution below the resolution of light, in other words, it is capable to achieve the resolution below the 50 nm.

In order to achieve the resolution below 50 nm, it is desirable for WD (working distance) to be below 50 nm to 70 nm of the resolution as shown in FIG. 5. Moreover, the resolution of 1 nm can be achieved by using the electron beam as clearly shown in FIG. 5. However, even though the electron beam is used, high resolution cannot be achieved if the distance (working distance (WD)) between the objective lens and a sample is long.

For example, the WD should be less than almost 7 mm as shown in FIG. 5, in order to maintain the resolution of 5 nm with one objective lens. Therefore, the objective lens should be as close as possible to the sample.

However, it is necessary to adjust dynamically each aberration such as astigmatism, curvature, distortion, and so on in cooperation with the scanned in order to scan wide field of 1 mm by the WD of 7 mm.

However, in this condition, because the distortion aberration reaches 1 mm, it is difficult to correct the distortion in a correction circuit. Moreover, a problem such as inability of correction of the distortion with the correction circuit is generated.

Furthermore, even though the distortion is corrected by force, operation and the adjustment become complicated as raising cost. Off-axis chromatic aberration, which is hard to correct, reaches close to 150 nm. On the other hands, the off-axis chromatic aberration becomes larger by making the WD longer, and as a result, the resolution of 5 nm cannot be maintained.

One objective lens of the scanning electron microscope to inspect the pattern on wafer printed from the mask cannot cover the incompatible functions such as large area inspection function and high resolution observation function.

Moreover, FIG. 5 is a graph showing relation between the resolution when the electric potential E of sample is −2.5 kV with 3 kV of acceleration voltage and distance from the sample to center of the objective lens.

SUMMARY OF THE INVENTION

The present invention is made in view of the prior art and it is therefore an object of the present invention is to provide a scanning electron microscope which can overcome incompatible requirements by using provided more than two objective lens disposed adjacent to optical axis direction such as objective lens with short focal length disposed near side of sample for high resolution observation and objective lens with long focal length disposed far side of the sample for scanned large area.

The scanning electron microscope includes a electron source to radiate electron beam, a objective lens system to focus the radiated electron beam on the sample, a scanned system to scan the focused electron beam on the sample, a second electron detection system to detect second electron emitted from the sample, and a second electron image display system to display second electron image of the sample with second electron detection signal from the second electron detection system. The objective lens system consists of a first objective lens and a second objective lens, and the first objective lens is disposed in the near side of electron source. The second objective lens is disposed in the near side of sample and arranged adjacent with the first objective lens. A scanned coil or a scanned deflecting electrode to compose the scanned system and a second electron detector to compose the second electron detecting system are disposed in the electron source side of objective lens system. When the scanning electron microscope with a wide visual field mode is used, the first objective lens is mainly excited, and when the microscope with a high resolution mode is used, the second objective lens is mainly excited.

When the scanning electron microscope is used with the wide visual field mode, it is desirable to cancel the off-axis chromatic aberration by exciting dependently the second objective lens to opposite direction of excitation direction of the first objective lens as mainly exciting the first objective lens.

In the scanning electron microscope, it is also desirable that at least one of the first objective lens or the second objective lens of scanning electron microscope is formed by a plurality of exciting coils.

In the scanning electron microscope, it is desirable that the plurality of exciting coils of objective lens which is not excited is excited to the opposite direction to each other and composed synthesized magnet-motive force to be substantially zero, and it is desirable for the microscope to be composed that thermal change is hard to generate even the mode is changed.

More specifically, the first objective lens is provided with two pairs of separated coils in which one pair of separated coils consists of two separated coils with space between them in main axis direction of the objective lens system. A yoke is disposed in between one pair of the separated coils and the other pair of separated coils. When the objective lens is used as the wide visual field mode, magnet-motive force in the same direction is generated in the each separated coil of one pair of separated coils, and magnet-motive force in the same direction is generated in the each separated coil of the other pair of separated coils; however, the opposite magnet-motive force is generated from the generated magnet-motive force in the one pair of separated coils. When the objective lens is used as the high resolution mode, it is desirable to cancel the magnet-motive force of first objective lens by generating the magnet-motive force in the opposite direction mutually in each of the separated coils, which consist of two separated coils.

It is also desirable that the first and the second objective lens systems are composed of the exciting coil and the yoke respectively, and the objective lens systems is composed to share one part of the yoke to compose the second objective lens and one part of the yoke to compose the first objective lens. The first objective lens and the second objective lens are disposed in closer by composing the objective lens systems as described above.

Moreover, it is possible to compose that the first objective lens and the second objective lens are disposed concentrically, and the first objective lens is disposed inside the second objective lens.

DETAILED DESCRIPTION OF THE PREFERRED EMBODIMENTS

First Embodiment

Figure 1:
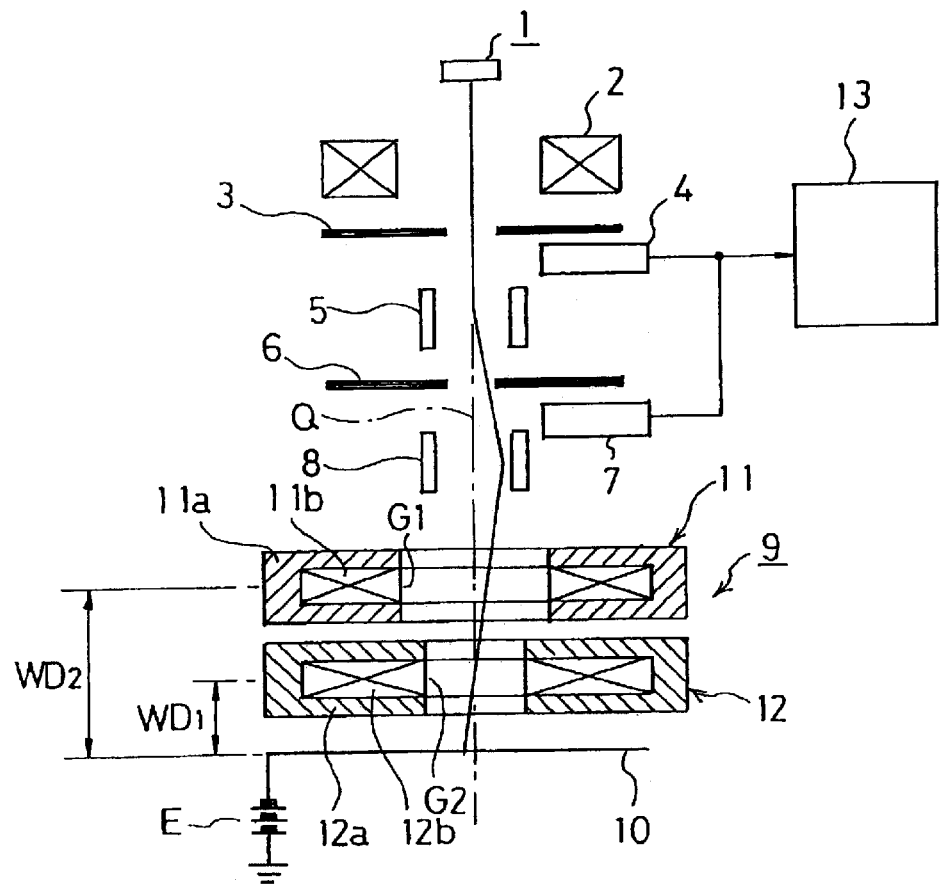
FIG. 1 is a block diagram of a scanning electron microscope according to a first embodiment of the present invention.

FIG. 1 is a block diagram of a scanning electron microscope according to a first embodiment of the present invention. In FIG. 1, reference numeral 1 denotes an electron source, reference numeral 2 a condensing coil to work as a condensing lens, reference numeral 3 a first target plate, reference numeral 4 a first detector, reference numeral 5 a first deflection system, reference numeral 6 a second target plate, reference numeral 7 a second detector, reference numeral 8 a second deflection system, reference numeral 9 a objective lens system, and reference numeral 10 a sample.

Electrons emitted from the electron source 1 are condensed by the condensing coil 2, and then led through the first target plate 3 to the first deflection system 5. The electrons led to the first deflection system 5 are deflected in a predetermined angle by the first deflection system 5, and then pass through the second target plate 6.

The electrons passed through the second target plate are deflected in a predetermined angle by the second deflection system 8, and then led to the objective lens system 9. Moreover, the first deflection system 5 and the second deflection system 8 are composed of, for example, a scanned coil and a scanned deflection electrode.

The objective lens system 9 is composed of a first objective lens 11 and a second objective lens 12.

Working Distance, WD2 from the center of the first objective lens 11 to the sample 10 is, for example, about 50 mm.

Working Distance, WD 1 from the center of the second objective lens 12 to the sample 10 is, for example, about 7 mm. The first objective lens 11 and the second objective lens 12 are disposed adjacent with respect to each other.

The first objective lens 11 is composed of a yoke 11a and an exciting coil 11b. The second objective lens 12 is composed of a yoke 12a and an exciting coil 12b. In FIG. 1, reference character G1 denotes a gap between polarities of the yoke 11a and reference character G2 denotes a gap between polarities of the yoke 12a, respectively. For example, load electric potential E of −2.5 KV is applied to the sample 10.

A scanning system to scan electron beam is composed of the first deflection system 5 and the second deflection system 8. A secondary electron detection system to detect secondary electrons is composed of the first target plate 3 and the first detector 4.

A reflection electron detection system to detect reflection electrons is composed of the second target plate 6 and the second detector 7. The secondary electron detection system and the reflection electron detection system are disposed in the vicinity of the electron source 1 than the position that the objective lens system 9 is disposed.

In the scanning electron microscpe having the configuration as described above, when the sample 10 is scanned by a high resolution mode, the exciting coil 12b in the second objective lens 12 is excited and the exciting coil 11b in the first objective lens 11 is not excited. In other words, the exciting coil 12b is mainly excited by introduction of electric current thereto.

Moreover, when the sample 10 is scanned by a wide visual field mode, the exciting coil 12b in the second objective lens 12 is not excited, and the exciting coil 11b in the first objective lens 11 is excited. In other words, the exciting coil 11b is mainly excited by introduction of electric current thereto.

The objective lens system 9 illuminates the electron beam on the sample 10 by condensing the electron beam. Since the load of electric potential E is applied to the sample 10, the secondary electron and the reflection electron from the sample 10 are emitted rapidly along with a main axis Q of the objective lens system 9 by scanning of this electron beam.

Since scattering angle of the reflection electron is larger than that of the secondary electrons, the reflection electrons impinge on the second target plate 6. Consequently, the secondary electrons emitted from the second target plate 6 are detected by means of the second detector 7.

On the other hands, the secondary electrons impinge on the first target plate 3. Therefore, the secondary electrons emitted from the first target plate 3 are detected by means of the first detector 4. Detection output of the first detector 4 and the second detector 7 is inputted into a display system 13 to display a secondary electron image and a reflection electron image.

According to the first embodiment, since the first objective lens 11 to scan the sample 10 by the wide visual field mode and the second objective lens 12 to scan the sample 10 by the high resolution mode are disposed adjacent, it is possible to achieve both of mutually incompatible functions such as large area inspection function and high resolution observation function.

Moreover, in this first embodiment, when the sample 10 is scanned by the wide visual field mode, the objective lens system is composed so that the exciting coil 11b of first objective lens 11 is excited and the exciting coil 12b of second objective lens 12 is not excited. When scanned the sample 10 by the high resolution mode, the objective lens system is composed so that the exciting coil 12b of second objective lens 12 is excited and the exciting coil 11b of first objective lens 11 is not excited.

However, when the sample 10 is further scanned by the wide visual field mode, it is possible to cancel off-axis chromatic aberration by composing the objective lens system in such a manner that lines of magnetic force of both exciting coils 12b in the second objective lens 12 and the exciting coil 11b in the first objective lens 11 are generated in the opposite directions respectively.

MODIFIED EXAMPLE 1

Figure 2:
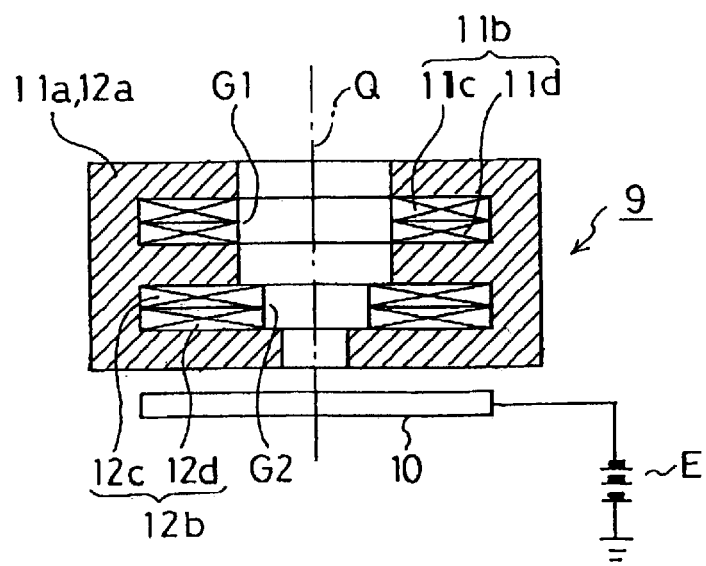
FIG. 2 is an explanatory diagram of a first modified example for an objective lens shown in FIG. 1.

In FIG. 2, the yoke 11a to constitute one part of the first objective lens 11 and the yoke 12a to constitute one part of the second objective lens 12 are shared, the exciting coil 11b which composes one part of the first objective lends 11 is composed of a pair of separated coils 11c and 11d, and then the exciting coil 12b, which composes one part of the second objective lens 12, is composed of a pair of separated coils 12c and 12d.

In case of the objective lens system 9 shown in FIG. 2, the objective lenses 11, 12 are both excited as explained below.

In other words, when the sample 10 is scanned by the wide visual field mode, the each of the separated coils 11c and 11d is excited in such a manner that a direction of line of magnetic force (direction of magnet-motive force) by the separated coil 11c in the first objective lens 11 and a direction of line of magnetic force (direction of magnet-motive force) by the separated coil 11d are same.

On the other hands, each of the separated coils 12c and 12d is excited in such a manner that a direction of the line of magnetic force (direction of magnet-motive force) by the separated coil 12c in the second objective lens 12 and a direction of the line of magnetic force (direction of magnet-motive force) by the separated coil 12d are reverse.

On the contrary, when the sample 10 is scanned by the high resolution mode, each of the separated coils 12c and 12d is excited in such a manner that the direction of the line of magnetic force (direction of magnet-motive force) by the separated coil 12c in the second objective lens 12 and the direction of line of magnetic force (direction of magnet-motive force) by the separated coil 12d are same.

On the other hands, each of the separated coils 11c and 11d is excited in such a manner that the direction of line of magnetic force (direction of magnet-motive force) by the separated coil 11c of first objective lens 11 and the direction of line of magnetic force (direction of magnet-motive force) by the separated coil 11d are reverse.

As mentioned above, when the wide visual field mode is used, the direction of magnet-motive force of each of the separated coils 11c and 11d of the first objective lens 11 is directed in the same direction, and meantime, the direction of magnet-motive force of each of the separated coils 12c and 12d is directed in the opposite direction.

On the other hands, when the high resolution mode is used, the direction of magnet-motive forces of each of the separated coils 12c and 12d in the second objective lens are directed in the same direction, and meantime, the direction of magnet-motive forces of each of the separated coils 11c and 11d in the first objective lens are directed in the opposite direction respectively.

As a result, when using the wide visual field mode, the magnet-motive forces in the opposite direction of second objective lens 12 are canceled each other, and when using the high resolution mode, the magnet-motive forces of in the opposite direction first objective lens 11 are canceled each other.

Moreover, even in case of both operation modes, the wide visual field mode and the high resolution mode, when the mode is switched between the wide visual field mode and the high resolution mode, thermal change can be controlled to promote stability of image since electric current keeps applying to the each exciting coil.

MODIFIED EXAMPLE 2

Figure 3:
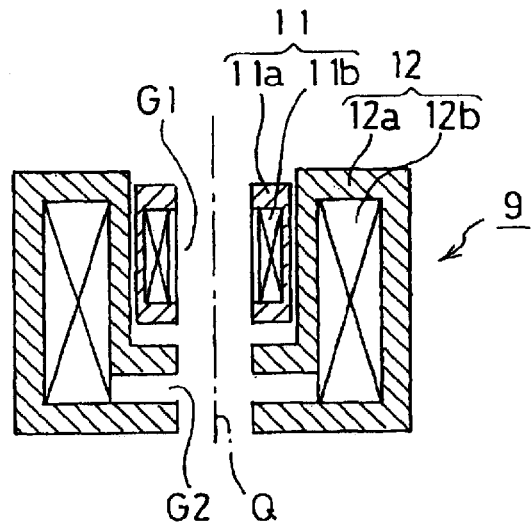
FIG. 3 is an explanatory diagram of a second modified example for the objective lens shown in FIG. 1.

FIG. 3 shows that a first objective lens 11 and a second objective lens 12 are composed of main and sub lenses respectively. In this modified example 2, the first objective lens 11 and the second objective lends 12 are disposed concentrically.

In other words, a yoke 12a of the second objective lens 12 is formed into a cylinder structure which includes inner/outer dual cylinder walls, and a cylindrical yoke 11a is disposed in space surrounded by an inner cylinder wall. The first objective lens 11 and the second objective lens 12 are disposed concentrically, and the first objective lens 11 is disposed inside the second objective lens 12.

With this configuration, the first objective lens 11 and the second objective lens 12 are disposed to further approach to each other.

Second Embodiment

Figure 4:
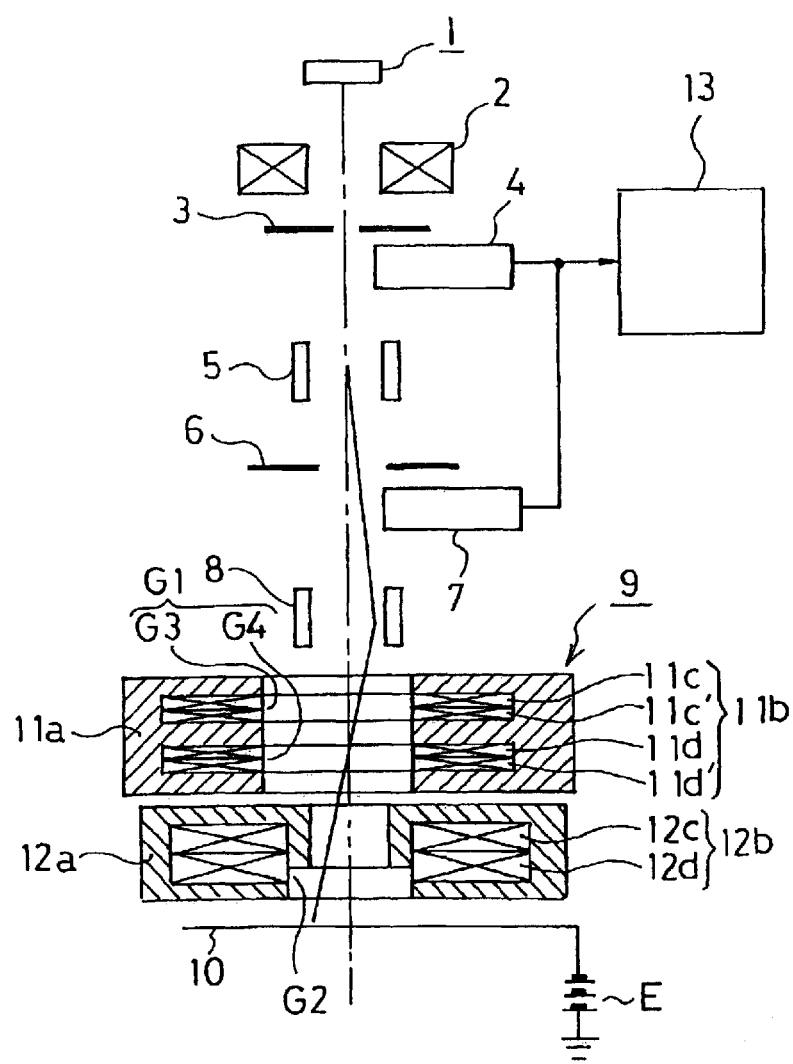
FIG. 4 is a block diagram of a scanning electron microscope according to a second embodiment of the present invention.
Figure 5:
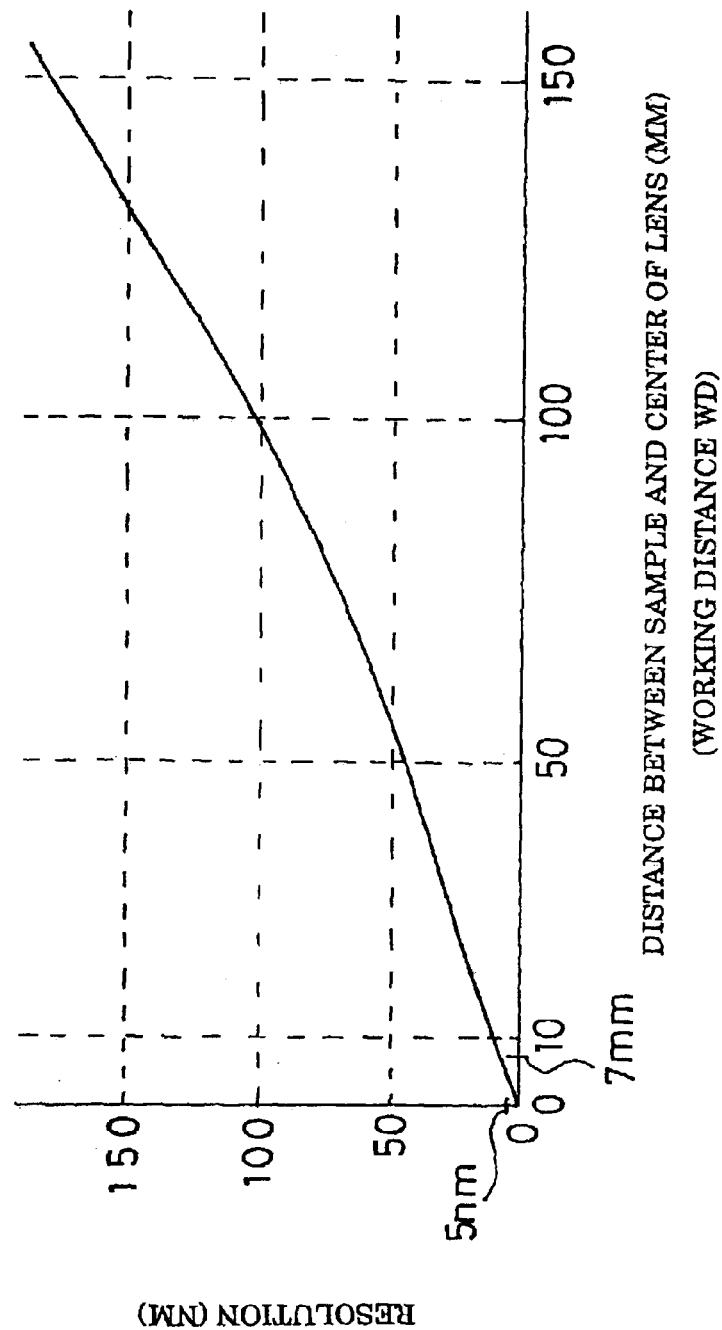
FIG. 5 is a graph showing a relationship between a working distance and a resolution.

FIG. 4 is a block diagram of a scanning electron microscope according to a second embodiment of present invention.

In the second embodiment, a yoke 11a to compose one part of a first objective lens 11 has two gaps. An exciting coil 11b of the first objective lens is composed of four separated coils 11c, 11c', 11d, and 11d'. An exciting coil 12b to compose one part of a second objective lens 12 is composed of separated coils 12c and 12d, similarly as the modified example 1.

The separated coils 11c and 11c' are formed as one pair of separated coils. The separated coils 11d and 11d' are formed as the other pair of separated coils. A yoke 11e is positioned between this one pair of separated coils 11c and 11c' and the other pair of separated coils 11d and 11d'.

In accordance with the second embodiment, a magnet-motive force is synthesized by applying electric current to each of the separated coils 12c and 12d in the second objective lens 12 in the same direction as the modification example 1, to operate as the one objective lens, similarly as the first embodiment.

On the other hands, the magnet-motive force of first objective lens 11 becomes zero by applying the opposite directional electric current to each of the separated coils 11d and 11d' together with applying the opposite directional electric current to each of the separated coils 11c and 11c' in the first objective lens 11.

Therefore, in order to operate the objective lens system 9 as the high resolution lens with short focal point, the pair of separated coils 11d and 11d' are excited in the opposite direction each other to make the magnet-motive force be zero as the other pair of separated coils 11c and 11c' are excited in the opposite direction each other to make the magnet-motive force be zero, and then electric current in the same direction is applied to the separated coils 12c and 12d in the second objective lens 12.

On the contrary, when the wide visual field mode is selected to observe, the electric current is applied to the separated coils 12c and 12d of second objective lens 12 in the opposite direction respectively, in order to make the magnet-motive force in the second objective lens be zero. Meanwhile, the magnet-motive force is generated by applying electric current in the same direction to the one set of separated coils 11c and 11c'.

The electric current in the same direction is applied to the one set of separated coils 11d and 11d' of first objective lens 11, but the opposite directional magnet-motive force is generated by applying electric current in the opposite direction to the direction of electric current applied to the separated-coils 11c and 11c'.

With this configuration, the first objective lens 11 has two gaps G3 and G4. Therefore, the off-axis chromatic aberration can be reduced when the sample 10 is scanned by the wide visual field mode.

Because the present invention is constructed as described above, it is possible to provide the scanning electron microscope which carries out both of mutually incompatible functions such as the wide visual field mode and high resolution mode.

What is claimed is:

1. A scanning electron microscope comprising:
    an electron source to radiate an electron beam;
    an objective lens system to focus the radiated electron beam on a sample;
    a scanning system to scan said focused electron beam on said sample;
    a secondary electron detection system to detect secondary electrons emitted from said sample; and
    a secondary electron image displaying system to display a secondary electron image of said sample with a secondary electron detection signal from said secondary electron detection system; wherein
    said objective lens system is composed of a first objective lens and a second objective lens;
    said first objective lens is arranged on a side near to said electron source;
    said second objective lens is disposed adjacent to said first objective lens and is arranged on a side near to said sample;
    said scanning system is a scanning coil;
    said secondary electron detection system is a secondary electron detector that is provided on the electron source side of said objective lens system; and
    said first objective lens is mainly excited when a wide visual field mode is used and said second objective lens is mainly excited when a high resolution mode is used.

2. A scanning electron microscope according to claim 1, wherein when a wide visual field mode is used, said first objective lens is mainly excited, and said second objective lens is dependently excited in a direction opposite to an excitation direction of said first objective lens to cancel off-axis chromatic aberration.

3. A scanning electron microscope according to claim 1, wherein at least one of said first objective lens and said second objective lens is formed of a plurality of exciting coils.

4. A scanning electron microscope according to claim 3, wherein a plurality of exciting coils, which are not mainly excited, are excited in a direction opposite to each other;
    synthesized magnet-motive force is composed to become substantially zero; and
    thermal change is hard to generate even though the mode is changed.

5. A scanning electron microscope according to claim 1, wherein said first objective lens is provided with two pairs of separated coils in which a first pair of separated coils is composed of two separated coils spaced in a main axis direction of said objective lens system;
    a yoke is disposed between said first pair of separated coils and a second pair of separated coils;
    when the wide visual field mode is used, magnet-motive forces in a same direction are generated in each separated coil of the first pair of separated coils, and magnet-motive forces in a same direction are generated in each separated coil of the second pair of separated coils, but opposite magnet-motive force is generated from the generated magnet-motive force in the first pair of separated coils; and
    when the high resolution mode is used, said magnet-motive forces of the first objective lens are canceled by generating magnet-motive forces in a direction opposite to each other in each separated coil which is composed as one pair.

6. A scanning electron microscope according to claim 1, wherein said first objective lens and said second objective lens comprise an exciting coil and a yoke respectively; and
    one part of the yoke constituting said first objective lens and one part of the yoke constituting said second objective lens are shared.

7. A scanning electron microscope according to claim 1, wherein said first objective lens system and said second objective lens system are disposed concentrically; and
    said first objective lens system is disposed inside said second objective lens system.

8. A scanning electron microscope comprising:
    an electron source to radiate an electron beam;
    an objective lens system to focus the radiated electron beam on a sample;
    a scanning system to scan said focused electron beam on said sample;
    a secondary electron detection system to detect secondary electrons emitted from said sample; and
    a secondary electron image displaying system to display a secondary electron image of said sample with a secondary electron detection signal from said secondary electron detection system; wherein
said objective lens system is composed of a first objective lens and a second objective lens;
said first objective lens is arranged on a side near to said electron source;
said second objective lens is disposed adjacent to said first objective lens and is arranged on a side near to said sample;
said scanning system is a scanning deflective electrode;
said secondary electron detection system is a secondary electron detector that is provided on the electron source side of said objective lens system; and
said first objective lens is mainly excited when a wide visual field mode is used and said second objective lens is mainly excited when a high resolution mode is used.

9. A scanning electron microscope according to claim 8, wherein when a wide visual field mode is used, said first objective lens is mainly excited, and said second objective lens is dependently excited in a direction opposite to an excitation direction of said first objective lens to cancel off-axis chromatic aberration.

10. A scanning electron microscope according to claim 8, wherein at least one of said first objective lens and said second objective lens is formed of a plurality of exciting coils.

11. A scanning electron microscope according to claim 10, wherein a plurality of exciting coils, which are not mainly excited, are excited in a direction opposite to each other;
synthesized magnet-motive force is composed to become substantially zero; and
thermal change is hard to generate even though the mode is changed.

12. A scanning electron microscope according to claim 8, wherein said first objective lens is provided with two pairs of separated coils in which a first pair of separated coils is composed of two separated coils spaced in a main axis direction of said objective lens system;
a yoke is disposed between said first pair of separated coils and a second pair of separated coils;
when the wide visual field mode is used, magnet-motive forces in a same direction are generated in each separated coil of the first pair of separated coils, and magnet-motive forces in a same direction are generated in each separated coil of the second pair of separated coils, but opposite magnet-motive force is generated from the generated magnet-motive force in the first pair of separated coils; and
when the high resolution mode is used, said magnet-motive forces of the first objective lens are canceled by generating magnet-motive forces in a direction opposite to each other in each separated coil which is composed as one pair.

13. A scanning electron microscope according to claim 8, wherein said first objective lens and said second objective lens comprise an exciting coil and a yoke respectively; and
one part of the yoke constituting said first objective lens and one part of the yoke constituting said second objective lens are shared.

14. A scanning electron microscope according to claim 8, wherein said first objective lens system and said second objective lens system are disposed concentrically; and
said first objective lens system is disposed inside said second objective lens system.

15. A scanning electron microscope comprising:
an electron source to radiate an electron beam;
an objective lens system to focus the radiated electron beam on a sample;
a scanning system to scan said focused electron beam on said sample;
a secondary electron detection system to detect secondary electrons emitted from said sample; and
a secondary electron image displaying system to display a secondary electron image of said sample with a secondary electron detection signal from said secondary electron detection system; wherein
said objective lens system is composed of a first objective lens and a second objective lens;
said first objective lens is arranged on a side near to said electron source;
said second objective lens is disposed adjacent to said first objective lens and is arranged on a side near to said sample;
said scanning system is a scanning deflective electrode;
said secondary electron detection system is a secondary electron detector that is provided on the electron source side of said objective lens system; and
said first objective lens is mainly excited when a wide visual field mode is used and said second objective lens is mainly excited when a high resolution mode is used.

16. A scanning electron microscope according to claim 15, wherein said first objective lens is arranged on a side near to said electron source: and
said second objective lens is disposed adjacent to said first objective lens and is arranged on a side near to said sample.

17. A scanning electron microscope according to claim 15, wherein when a wide visual field mode is used, said first objective lens is mainly excited, and said second objective lens is dependently excited in a direction opposite to an excitation direction of said first objective lens to cancel off-axis chromatic aberration.

* * * * *